United States Patent [19]

Wartski et al.

[11] Patent Number: 5,754,008
[45] Date of Patent: May 19, 1998

[54] DEVICE FOR CREATING A BEAM OF ADJUSTABLE-ENERGY IONS PARTICULARLY FOR SEQUENTIAL VACUUM TREATMENT OF SURFACES WITH LARGE DIMENSIONS

[75] Inventors: Louis Wartski, Montrouge; Véronique Roy, Paris; Christian Schwebel, Forges-les-Bains, all of France

[73] Assignee: Plasmion, Orsay, France

[21] Appl. No.: 765,348

[22] PCT Filed: Jul. 5, 1995

[86] PCT No.: PCT/FR95/00900

§ 371 Date: Feb. 10, 1997

§ 102(e) Date: Feb. 10, 1997

[87] PCT Pub. No.: WO96/01490

PCT Pub. Date: Jan. 18, 1996

[30] Foreign Application Priority Data

Jul. 5, 1994 [FR] France ................... 94 08279

[51] Int. Cl.⁶ ................................................ H01J 7/24
[52] U.S. Cl. ................ 315/111.91; 315/111.81; 315/111.31; 315/39; 313/293; 313/360.1; 250/492.21
[58] Field of Search ................ 315/111.91, 111.81, 315/111.31, 111.41, 39; 313/362.1, 265, 293, 363.1, 360.1; 250/423 R, 492.21, 492.3

[56] References Cited

U.S. PATENT DOCUMENTS

| | | | |
|---|---|---|---|
| 4,507,588 | 3/1985 | Asmussen et al. ................... | 315/39 |
| 4,894,546 | 1/1990 | Fukui et al. ................... | 315/111.81 X |
| 4,906,900 | 3/1990 | Asmussen ................... | 315/111.81 |
| 4,987,346 | 1/1991 | Katzschner et al. ................... | 315/111.41 |
| 5,173,640 | 12/1992 | Geisler et al. ................... | 315/111.21 |
| 5,188,862 | 2/1993 | Itatani et al. ................... | 427/570 |
| 5,218,210 | 6/1993 | Mcintyre, Jr. et al. ................... | 250/492.2 |

FOREIGN PATENT DOCUMENTS

| | | |
|---|---|---|
| 0326824 | 8/1989 | European Pat. Off. . |
| 0420117 | 4/1991 | European Pat. Off. . |
| 0486943 | 5/1992 | European Pat. Off. . |
| 2-132798 | 5/1990 | Japan . |

*Primary Examiner*—Robert Pascal
*Assistant Examiner*—Haissa Philogene
*Attorney, Agent, or Firm*—Oliff & Berridge, PLC

[57] ABSTRACT

A device for generating an ion beam, particularly for the continuous processing of large surfaces, includes an ionising chamber with a gas being fed thereinto to be acted upon by a high frequency alternating electrical field, extraction optics capable of extracting ions from the ionising chamber and generating an ion beam from the device, and excitation means capable of creating the high frequency alternating electrical field within the ionising chamber through a connection, by a waveguide, to a microwave generator. The excitation means include a conductive enclosure engaging one wall of the ionising chamber, wherein the inner space of the conductive enclosure is divided into a first portion, opposite the ionising chamber, to which the waveguide is connected, and a second portion, adjacent the ionising chamber, in which cylindrical conductive cavities are uniformly distributed, with each cavity comprising an adjusting means for adjusting the amount of microwave energy passing through that cavity.

8 Claims, 2 Drawing Sheets

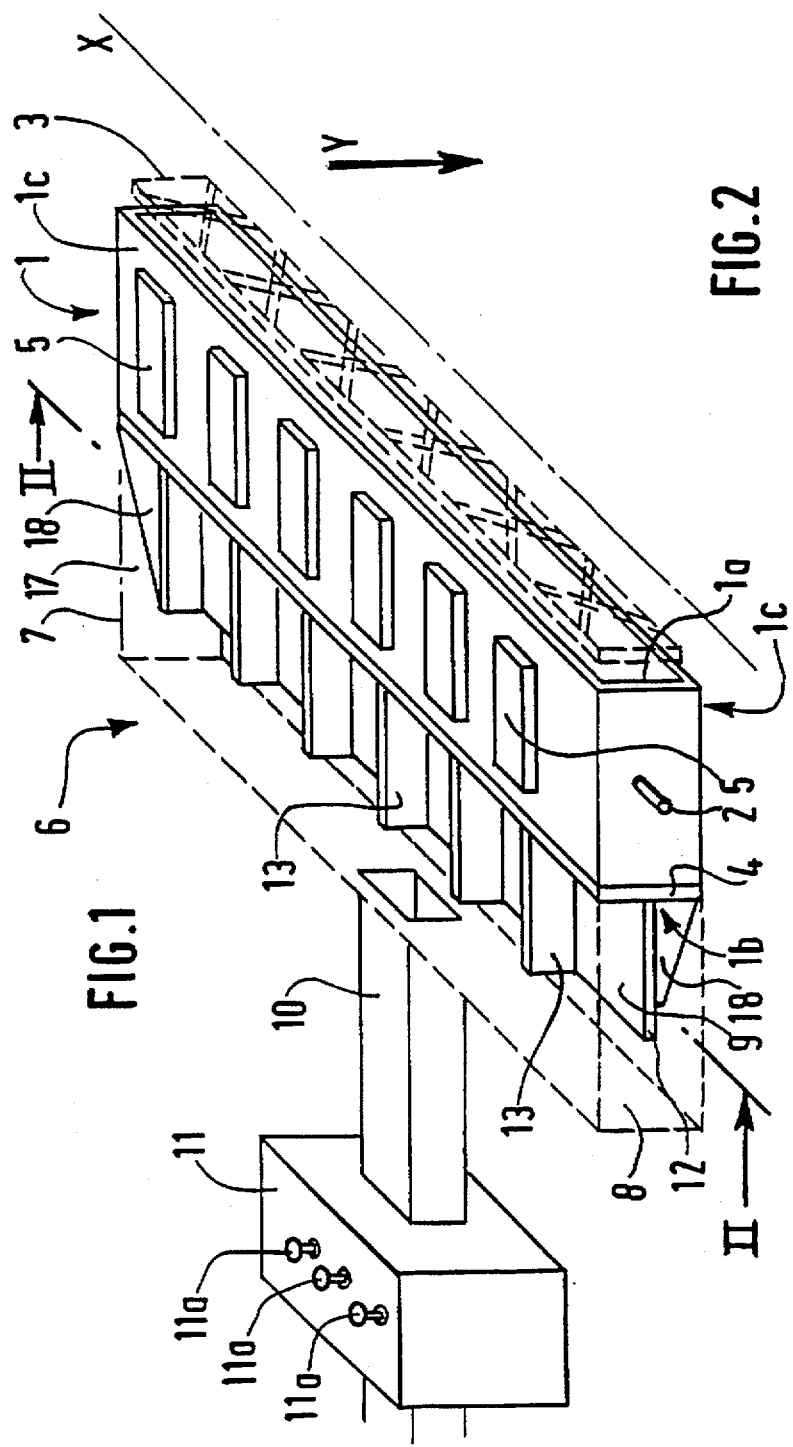
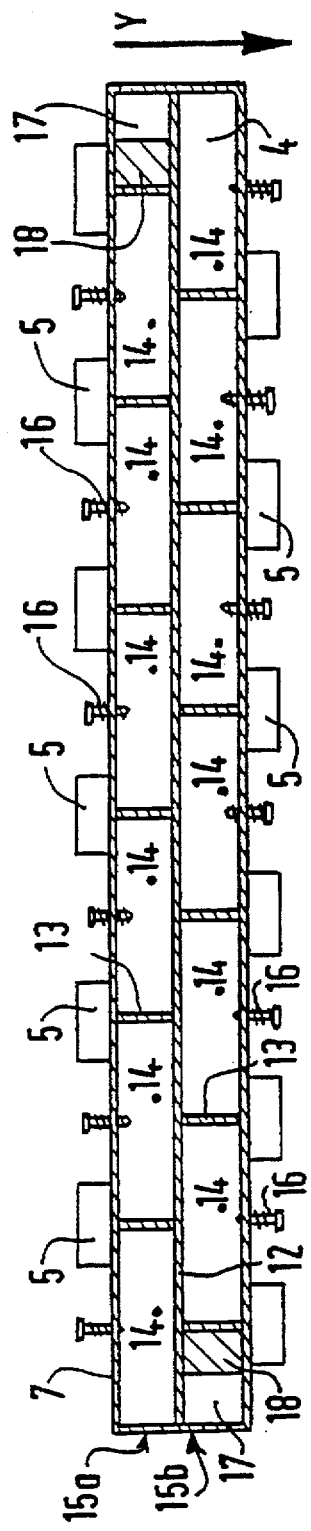

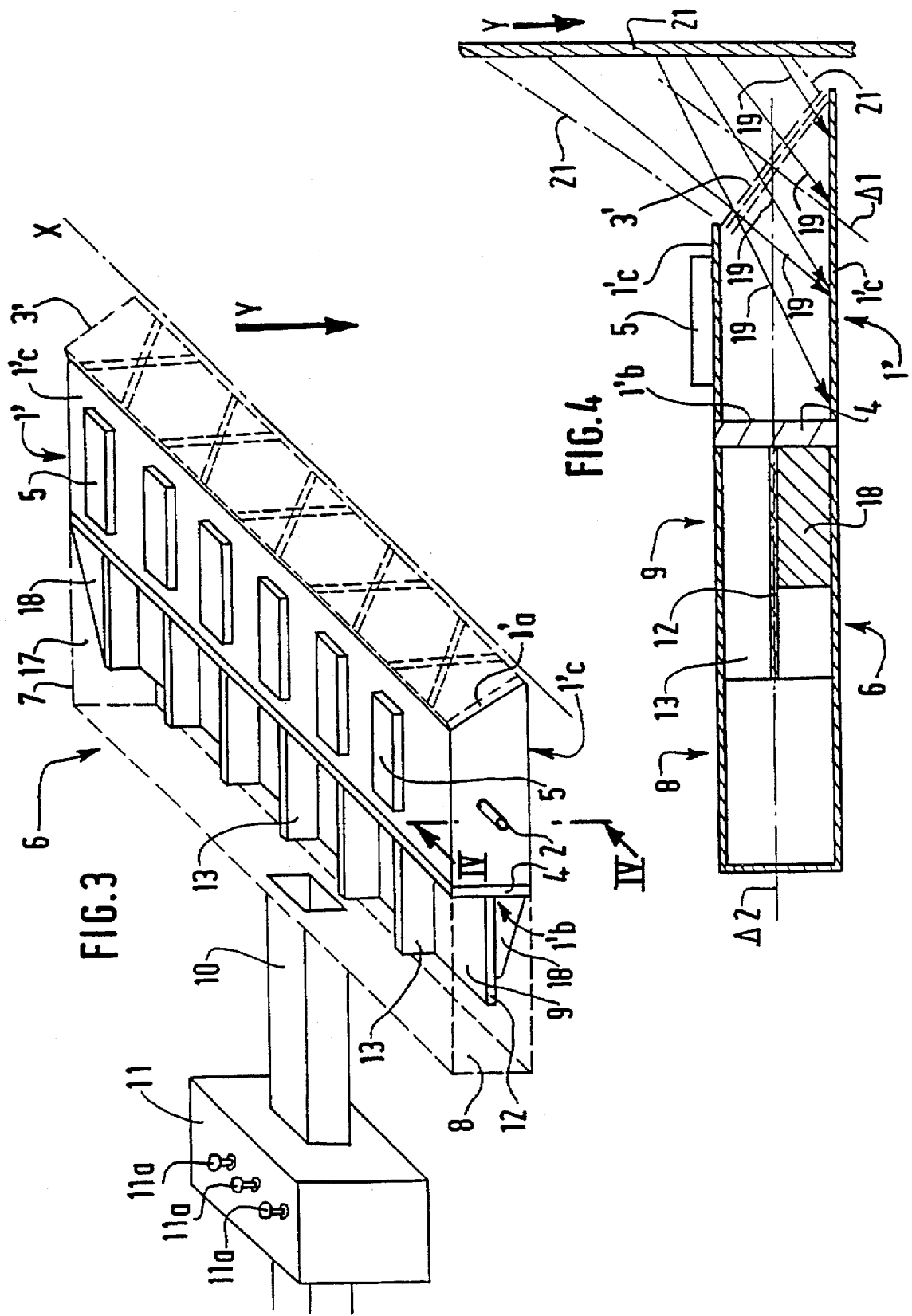

DEVICE FOR CREATING A BEAM OF ADJUSTABLE-ENERGY IONS PARTICULARLY FOR SEQUENTIAL VACUUM TREATMENT OF SURFACES WITH LARGE DIMENSIONS

BACKGROUND OF THE INVENTION

1. Field of the Invention

The present invention relates to a device for creating a beam of adjustable energy ions particularly for sequential vacuum treatment of surfaces with large dimensions.

2. Description of Related Art

For treatment of automobile sheet metal in particular, to improve its corrosion resistance, it is known to bombard it with ions obtained by ionization of an appropriate gas such as nitrogen. Sequential treatment of a piece of sheet metal consists of moving the latter in the field of a fixed ion beam so that the beam of ions sweeps the entire surface of the metal. Depending on the density of the ion beam, the metal is moved at an appropriate rate to achieve the desired bombardment.

In order to implement this technique, it is preferable to have a very wide beam of ions. In this case, however, the problem arises of generating a beam of ions that is sufficiently dense and uniform over its entire width.

SUMMARY OF THE INVENTION

The goal of the present invention is to furnish a device able to provide a dense, wide beam of ions with good homogeneity that is particularly suited for sequential treatment of surfaces with large dimensions. The present invention relates to a device for creating a beam of ions particularly for sequential treatment of surfaces with large dimensions, having an ionization chamber into which a gas can be introduced to be subjected to the action of an alternating high-frequency electrical field, extraction optics able to extract ions from the ionization chamber and emit a beam of ions from the device, and excitation means able to establish the alternating high-frequency electrical field inside the ionization chamber, being connected by a waveguide to a microwave generator, characterized in that said excitation means include a conducting enclosure abutting a wall of the ionization chamber, the interior of this enclosure being divided into a first part opposite the ionization chamber in which the waveguide terminates and a second part adjacent to the ionization chamber that contains essentially identical cylindrical conducting cavities open at both their ends, the lengthwise axes of said cavities being parallel to each other and perpendicular to said wall of the ionization chamber, each cavity having an adjusting element to adjust the quantity of microwave energy passing through said cavity.

According to the invention, "cylindrical cavity" is understood to be a cavity with a constant cross section. This cross section can be of any shape, preferably rectangular. It will be understood that the excitation means according to the invention constitute a power divider which has the function of distributing the energy furnished by the microwave generator among the various cavities, each of which constitutes an independent waveguide that radiates into said ionization chamber at its aperture adjacent to the ionization chamber. Since the cavities are substantially identical, each emits the same quantity of energy into the ionization chamber. In addition, since the cavities are regularly distributed in the enclosure, the electrical field generated in the ionization chamber exhibits good homogeneity.

In a preferred embodiment of the invention, the cavities are aligned in two rows parallel to the large dimension of the surface of the ionization chamber located opposite the extraction optics, and are disposed in a staggered arrangement in these two rows. In this embodiment, displacement of the parts to be treated, in a direction perpendicular to the two rows of cavities, improves the homogeneity of the ionic treatment of each part still further, since the less-dense areas of the first row are compensated by the denser areas of the second row, and vice versa.

According to the invention, the ionization chamber is separated from the conducting enclosure by a dielectric window impermeable to the gases to be ionized and permeable to electromagnetic waves. If it is subjected to the action of any metal particles emitted by the surface of the part during treatment, the dielectric window tends to metallize and hence lose its dielectric properties. As a result, the efficiency of the device may be impaired. It is thus necessary to replace said dielectric window, said replacement posing no problem for devices with small dimensions.

On the other hand, the device according to the invention has a large dielectric window which is an expensive, difficult-to-replace part. To overcome this disadvantage in a preferred embodiment of the invention, the axis of the extraction optics is inclined relative to the lengthwise axis of the device in order to prevent any metal particles emitted by the surface of the part during treatment from reaching said dielectric window.

In a preferred embodiment of the invention, the outer wall of the ionization chamber has permanent magnets that create a static magnetic field in the ionization chamber. Because of the combination of the alternating electrical field and the static magnetic field, ionization efficiency is increased by the known phenomenon of cyclotron electron resonance.

BRIEF DESCRIPTION OF THE DRAWINGS

For better understanding of the invention, two embodiments will now be described, provided as non-limiting examples with reference tithe attached drawing wherein:

FIG. 1 is a perspective view of a device according to a first embodiment of the invention, FIG. 2 is a cross-sectional view along II—II of FIG. 1, FIG. 3 is a view similar to FIG. 1 of a device according to a second embodiment of the invention, and FIG. 4 is an enlarged cross-sectional view along IV—IV in FIG. 3.

DETAILED DESCRIPTION OF THE PREFERRED EMBODIMENTS

The device shown in the drawing has an ionization chamber 1 into which a gas can be introduced through an orifice 2. Chamber 1, which is parallelepipedic, is elongate in a direction X. Extraction optics 3 preferably having three grids are placed in front of one of the faces 1a of the ionization chamber. The axis of the grids is parallel to the lengthwise axis of the device.

On its face 1b opposite face 1a, the ionization chamber has a wall made of a dielectric material permeable to microwaves, quartz for example, which constitutes a vacuum-tight and hence a gas-tight dielectric window in the sense of the invention. Permanent magnets 5 are disposed on the long sides 1c of the ionization chamber. In known fashion, two adjacent magnets have opposite polarities.

A power divider 6 is applied against face 1b of ionization chamber 1. This power divider 6 has an electrically conducting enclosure 7, shown in dashed lines, with the same cross section as ionization chamber 1. According to the invention, the interior of enclosure 7 is divided into a first part 8 opposite ionization chamber 1 and a second part 9 contiguous to the first part and adjacent to ionization chamber 1.

A waveguide 10 terminates inside enclosure 7 in its first part 8. This waveguide 10 is connected to an impedance matching device 11 which advantageously has three tuning plungers 11a, and is itself supplied by a microwave generator, not shown. The second part 9 of enclosure 7 has cylindrical conducting cavities with a rectangular cross section and with the same dimensions, which are formed by a single wall 12 parallel to direction X and extend over the entire length of enclosure 7, and by partitions 13 perpendicular to wall 12 disposed on either side of said wall. Wall 12 and partitions 13 are electrically conducting.

In the cross-sectional view of FIG. 2, it can be clearly seen that cavities 14 thus defined in the second part 9 of enclosure 7 have the same dimensions. Cavities 14 are thus aligned in two parallel rows 15a and 15b and are also disposed in a staggered arrangement in these two rows. In this way, when parts to be treated move in a direction Y perpendicular to direction X, they are sequentially subjected to the action of the first beam of ions coming from row 15a and to that of a second beam of ions coming from row 15b such that the two successive ion treatments are superimposed, allowing any lack of homogeneity in the beam of each row to be offset, particularly between the central regions of cavities 14 and the adjacent regions of walls 12 and partition 13.

In order to ensure good distribution of microwave energy between the various cavities 14, enclosure 7 also has, on its long sides, adjusting screws 16 each of which terminates in a cavity 14. The part of each adjusting screw 16 that terminates in corresponding cavity 14 constitutes an obstacle to the passage of the microwaves such that by turning this screw 16 to a greater or lesser degree, the quantity of energy passing through said cavity 14 is adjusted. Thus, the cavities furthest from the opening of waveguide 10 can radiate into ionization chamber 1 substantially the same quantity of energy as do the cavities located in the vicinity of the end of waveguide 10.

Due to the staggered arrangement of cavities 14 in the two rows 15a and 15b, small unused spaces 17 remain at one end of each row. The size of one of these spaces 17, in direction X, is equal to half the length of a cavity 14. In the embodiment shown, unused spaces 17 are occupied by conducting wedges 18 made of brass or aluminum, with a semiparallelepipedic shape, truncated in a diagonal plane. Wedges 18 are disposed in each space 17 with their bases abutting wall 4 of the ionization chamber. Thus the cross section of each wedge 18 increases from the interface between parts 8 and 9 of enclosure 7 in the direction of ionization chamber 1. In this way, any reflections of waves in the first part 8 of the enclosure that could interfere with energy distribution between cavities 14 is avoided.

In the example illustrated, the dimension of the device in direction X is approximately 50 cm and in direction Y, approximately 4 cm.

FIGS. 3 and 4 show a second embodiment of the invention in which extraction optics 3', also made of three grids, are positioned with axis $\Delta_1$ inclined relative to lengthwise axis $\Delta_2$ of the device. For this purpose, ionization chamber 1' has the shape of a semiparallelepiped whose cross section is a rectangle and whose front face 1'a is inclined relative to its rear face 1'b, as can be seen in FIGS. 3 and 4.

As shown in the cross-sectional view in FIG. 4, this arrangement of extraction optics 3' prevents any metal particles emitted by the surface of a part 20 subjected to a beam of ions delimited by dot-dashed lines 21 from reaching gas-tight window 4. It can be seen that trajectories 19 of the metal particles that pass through extraction optics 3 in the direction opposite that of the ion beam arrive at one of side walls 1'c of ionization chamber 1'. Hence, only this wall 1'c is able to metallize, which has no effect on formation of the ion beam. On the other hand, since gas-tight wall 4 is not impinged upon by metal particles, it retains its dielectric properties. It is hence no longer necessary to replace it.

It goes without saying that the embodiment that has just been described is not limiting in nature and may receive any desirable modifications without thereby departing from the scope of the invention.

We claim:

1. A device for creating a beam of ions, comprising:
   an ionization chamber into which a gas can be introduced;
   excitation means for subjecting the gas introduced into the ionization chamber to an alternating high-frequency electrical field to generate ions from the gas; and
   extraction optics capable of extracting ions from the ionization chamber and emitting a beam of the ions from the device;
   wherein the excitation means comprises a conducting enclosure abutting a wall of the ionization chamber, the conducting enclosure comprising:
   a first portion adjacent to the ionization chamber, and a second portion spaced from the ionization chamber by the first portion, wherein the first portion comprises a plurality of identically-shaped conducting cavities, each conducting cavity having a constant cross-section and opened at each end, a lengthwise axis of each of the plurality of conducting cavities being parallel to each other and being perpendicular to the wall of the ionization chamber, each conducting cavity having an adjusting element that adjusts a quantity of energy of the alternating high-frequency electrical field passing through the cavity.

2. The device of claim 1, wherein the second portion of the conducting enclosure is connectable to a first end of a waveguide, a second end of the waveguide connected to a microwave generator generating microwave energy which passes through the waveguide into the second portion of the conducting enclosure, the adjusting element of each cavity capable of adjusting a quantity of the microwave energy passing through that cavity.

3. The device of claim 1, wherein an axis of the extraction optics is inclined relative to a lengthwise axis of the device.

4. The device of claim 3, wherein the extraction optics directs the beam of ions against a metal object having a large dimension.

5. The device of claim 3, further comprising a dielectric window separating the ionization chamber from the conducting enclosure, an inclination of the inclined axis of the extraction optics preventing metal particles emitted from a surface of the metal object from reaching the dielectric window.

6. The device according to claim 1, wherein the plurality of cavities are arranged into two rows, each row parallel to a lengthwise direction of the ionization chamber, the cavities of a first one of the two rows offset relative to the cavities of a second one of the two rows.

7. The device of claim 1, further comprising a plurality of permanent magnets disposed on a second wall of the ionization chamber extending between the excitation means and the extraction optics, the plurality of permanent magnets creating a static magnetic field in the ionization chamber.

8. The device of claim 1, wherein the plurality of cavities are formed by:

a wall of the excitation means extending along a length of the first portion of the excitation means and which extends between the ionization chamber and the second portion; and a plurality of partitions extending perpendicularly from the wall of the excitation means, the plurality of partitions disposed on both faces of the wall of the excitation means.

* * * * *